United States Patent
Shah

(10) Patent No.: US 9,332,629 B2
(45) Date of Patent: May 3, 2016

(54) FLIP CHIP BUMP ARRAY WITH SUPERIOR SIGNAL PERFORMANCE

(75) Inventor: Jitesh Shah, Fremont, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 1450 days.

(21) Appl. No.: 12/938,196

(22) Filed: Nov. 2, 2010

(65) Prior Publication Data

US 2012/0104596 A1  May 3, 2012

(51) Int. Cl.
| | |
|---|---|
| *H01L 23/488* | (2006.01) |
| *H05K 1/11* | (2006.01) |
| *H05K 1/02* | (2006.01) |
| *H01L 23/50* | (2006.01) |
| *H01L 23/528* | (2006.01) |
| *H01L 23/498* | (2006.01) |
| *H05K 3/34* | (2006.01) |

(52) U.S. Cl.
CPC .............. *H05K 1/0219* (2013.01); *H01L 23/50* (2013.01); *H01L 23/5286* (2013.01); *H01L 23/49822* (2013.01); *H01L 23/49838* (2013.01); *H01L 2224/16225* (2013.01); *H01L 2224/16227* (2013.01); *H01L 2924/15311* (2013.01); *H05K 3/3436* (2013.01); *H05K 2201/10674* (2013.01)

(58) Field of Classification Search
USPC ......... 257/684, 690–700, 707, 719, 778, 737, 257/773, 780, E23.026; 174/261
IPC .................. H01L 23/488,23/528; H05K 1/0219
See application file for complete search history.

(56) References Cited

U.S. PATENT DOCUMENTS

| | | | |
|---|---|---|---|
| 6,207,476 B1 | 3/2001 | Zhao et al. | |
| 6,479,758 B1 | 11/2002 | Arima et al. | |
| 7,319,269 B2 | 1/2008 | Osburn | |
| 7,566,960 B1 * | 7/2009 | Conn | 257/686 |
| 7,656,007 B2 | 2/2010 | Shah | |
| 2004/0188856 A1 | 9/2004 | Hsu | |
| 2008/0079135 A1 | 4/2008 | Shah | |
| 2009/0085158 A1 | 4/2009 | Shah | |

OTHER PUBLICATIONS

Howard Johnson PhD, Spread your returns, Mar. 31, 2005, 20 EDN, Electronic Design News, www.edn.com.

* cited by examiner

*Primary Examiner* — Marcos D Pizarro
(74) *Attorney, Agent, or Firm* — Roeder & Broder LLP

(57) ABSTRACT

An integrated circuit (342) that is electrically connected to a printed circuit board (246) with a package substrate (344) includes a circuit body (352), and a bump array (354) that electrically connects the circuit body (352) to the package substrate (244). The bump array (354) includes a first bump set (356) having a plurality of signal bumps (364) and a plurality of non-signal bumps (366) alternatingly interspersed and aligned along an axis. With the present design, the bump array (354) allows each signal bump (364) to be surrounded by a power bump (370) and a ground bump (368). The package substrate (344) includes (i) a package body (372); and (ii) a pin array (374) that includes a first pin set (376) that includes a plurality of signal pins (384) and a plurality of non-signal pins (386) alternatingly interspersed and aligned along an axis.

20 Claims, 5 Drawing Sheets

FLIP CHIP BUMP ARRAY WITH SUPERIOR SIGNAL PERFORMANCE

BACKGROUND

It is well known that integrated circuits (also referred to as "chips") are often coupled to a printed circuit board using a package substrate (also sometimes referred to herein as a "package"). In a typical flip type chip, the bottom of the chip includes a bump array having a plurality of solder bumps that are used to electrically connect and bond the chip to the package substrate.

FIG. 1A is a simplified top illustration of a portion of a typical prior art bump array 10P positioned on a prior art package substrate 12P, and FIG. 1B is a simplified cut-away view taken on line 1B-1B of FIG. 1A. The prior art bump array 10P includes a plurality of signal bumps 14P, a plurality of ground bumps 16P, and a plurality of power bumps 18P. Further, in this design, the package substrate 12P includes a plurality of signal traces 20P positioned in a signal layer that are electrically connected to the signal bumps 14P, a ground plane 24P that is electrically connected to the ground bumps 16P with ground vias 26P, and a power plane 28P that is electrically connected to the power bumps 18P with power vias 30P.

The prior art flip chip bump array 10P illustrated in FIGS. 1A and 1B includes two rows of signal bumps 14P, followed by a row of ground bumps 16P, and a row of power bumps 18P. This arrangement makes it possible to use (i) a common signal layer in the package substrate 12P for the individual signal traces 20P, (ii) a solid ground plane 24P in the package substrate 12P for connecting to the ground bumps 16P, and (iii) a solid power plane 28P in the package substrate 12P for routing the power bumps 18P.

Unfortunately, with this design, the signal traces 20P for the signal bumps 14P in the second row of signal bumps 14P include a necked down region 32P having a reduced trace width. This necked down region 32P creates a high impedance region for that section of the signal traces 20P. Moreover, with this design, the signal traces 20P are tightly coupled. This increases signal-to-signal crosstalk between the signal traces 20P.

SUMMARY

The present invention is directed toward an integrated circuit that is electrically connected to a printed circuit board, for example, with a package substrate. As provided herein, the integrated circuit can include a circuit body, and a bump array that electrically connects the circuit body to the package substrate. In one embodiment, the bump array includes a first bump set having a plurality of signal bumps and a plurality of non-signal bumps alternatingly interspersed and aligned along an axis. In certain embodiments, with the present design, the bump array allows each signal bump to be surrounded by a power bump and a ground bump. This can significantly reduce signal-to-signal crosstalk, and provide clean signal traces with no escape neckdowns in the package substrate.

As provided herein, the bump array can additionally include (i) a second bump set that includes a plurality of signal bumps and a plurality of non-signal bumps alternatingly interspersed and aligned along an axis, (ii) a third bump set that includes a plurality of signal bumps and a plurality of non-signal bumps alternatingly interspersed and aligned along an axis, and/or (iii) a fourth bump set that includes a plurality of signal bumps and a plurality of non-signal bumps alternatingly interspersed and aligned along an axis. In this embodiment, each of the bump sets can be substantially rectangular tube shaped, and the fourth bump set can encircle the third bump set, the third bump set can encircle the second bump set, and the second bump set can encircle the first bump set.

In one embodiment, each non-signal bump in the first bump set is a ground bump. In another embodiment, each non-signal bump in the first bump set is a power bump. In yet another embodiment, the non-signal bumps of the first bump set include both power bumps and ground bumps, and the power bumps and the ground bumps are alternatingly interspersed. In still another embodiment, the non-signal bumps of the first bump set can be power bumps, while the non-signal bumps of the second bump set can be ground bumps.

The present invention is also directed to a package substrate that includes (i) a package body; and (ii) a pin array that includes a first pin set that includes a plurality of signal pins and a plurality of non-signal pins alternatingly interspersed and aligned along an axis. In this embodiment, the first pin row is fixedly and electrically connected to the first bump row.

In yet another embodiment, the present invention is directed to a circuit assembly that includes both the integrated circuit and the package substrate electrically connected to the integrated circuit.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
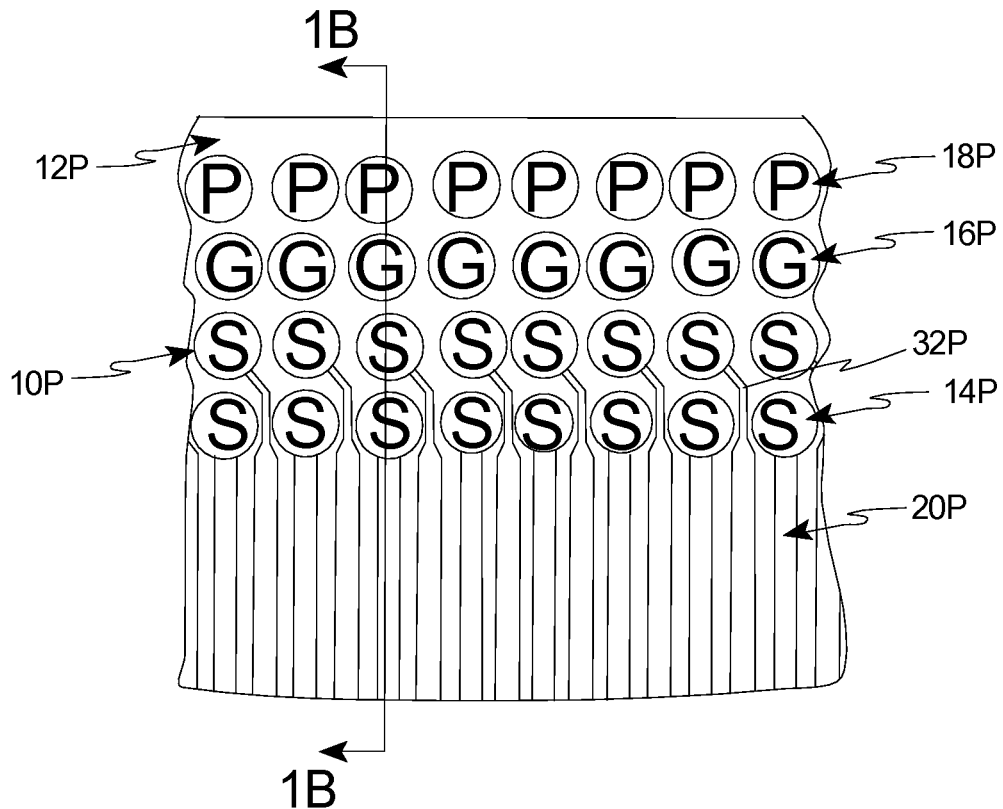
FIG. 1A is a simplified top illustration of a portion of a typical prior art bump array positioned on a prior art package substrate.
Figure 1B:
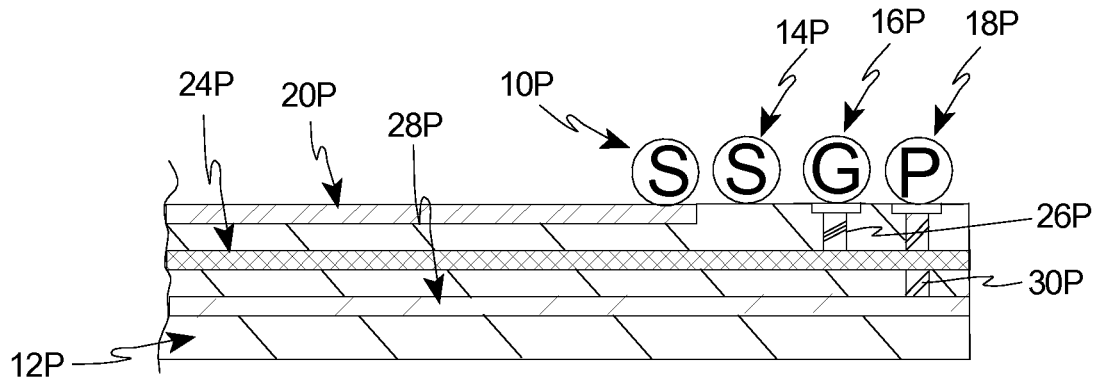
FIG. 1B is a simplified cut-away prior art view taken on line 1B-1B of FIG. 1A.
Figure 2:
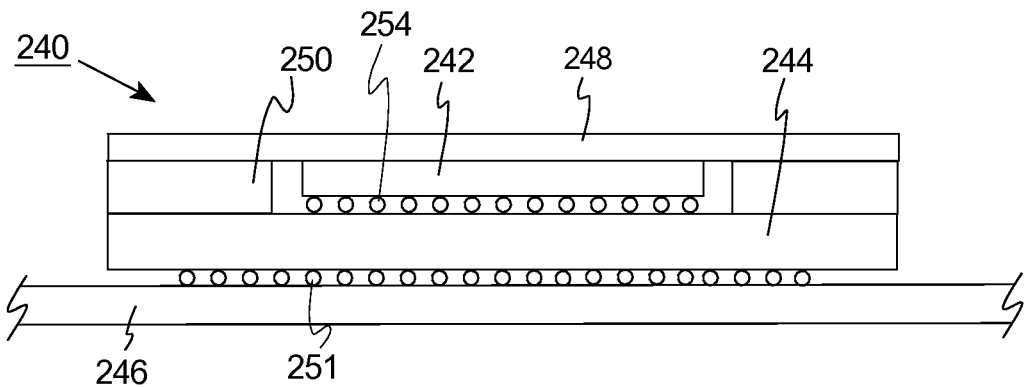
FIG. 2 is a simplified side view of a circuit assembly having features of the present invention.

FIG. 2 is a simplified side view of a circuit assembly 240 including an integrated circuit 242, a package substrate 244, a printed circuit board 246, a heat spreader 248 and a support structure 250. The design of these components can be varied pursuant to the teachings provided herein. In one embodiment, the integrated circuit 242 includes an improved bump array 254, and the package substrate 244 is uniquely designed to significantly reduce signal-to-signal crosstalk and provide clean signal traces with no escape neckdowns. This can improve the performance of the circuit assembly 240.

The printed circuit board 246 supports the package substrate 244 and the integrated circuit 242. In FIG. 2, a PC bump array 251 is used to electrically and mechanically connect the package substrate 244 to the printed circuit board 246.

The heat spreader 248 is positioned near the integrated circuit 242 and is used to spread, distribute or otherwise disperse heat to protect the integrated circuit 242 and/or the package substrate 244 from being subjected to excessive temperatures, for example. In one embodiment, the heat spreader 248 can be formed from a material having a relatively high thermal conductivity. For example, the heat spreader 248 can be formed from a metallic material, or any other suitable material.

The support structure 250 can be positioned between the heat spreader 248 and the package substrate 244. The support structure 250 can provide a protective barrier for an otherwise exposed edge of the integrated circuit 242. Additionally, the support structure 250 can fill the gap that would otherwise exist between the heat spreader 248 and the package substrate 244 to provide structural stability to the integrated circuit 242. In one embodiment, the support structure 250 can be formed from a substantially non-conductive material, such as a dielectric material or another suitable material.

Figure 3A:
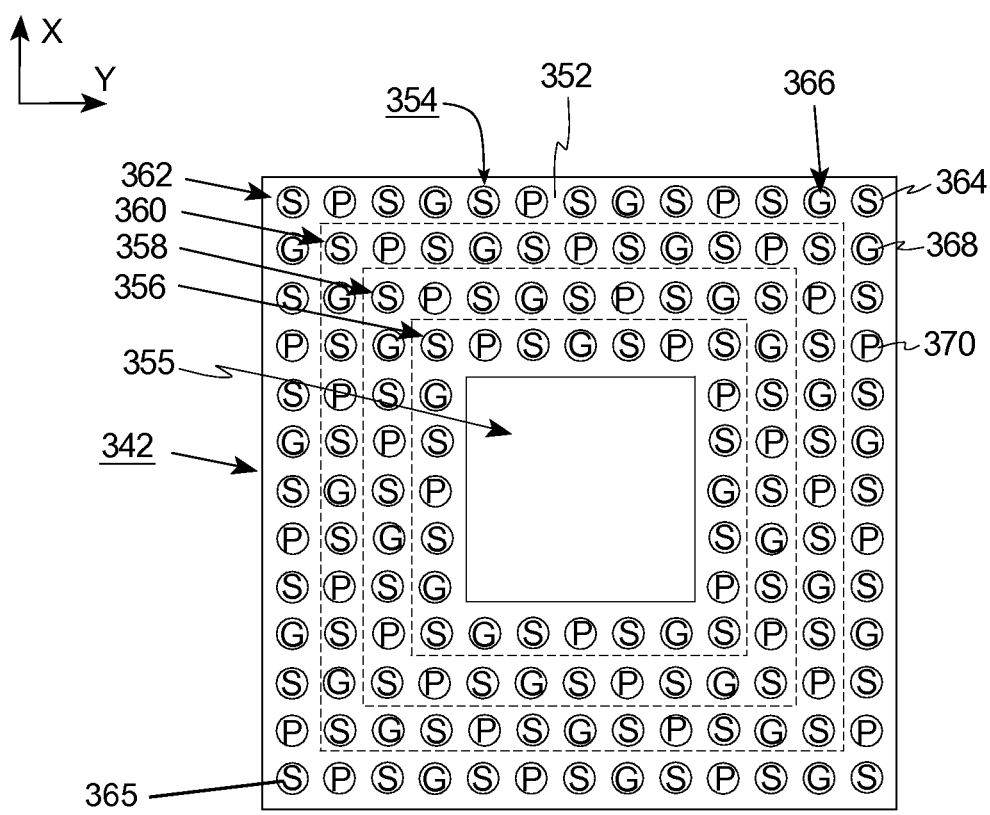
FIG. 3A is a simplified bottom illustration of an integrated circuit having features of the present invention.

FIG. 3A is a simplified bottom illustration of an integrated circuit 342 having features of the present invention. In this embodiment, the integrated circuit 342 includes a circuit body 352 that defines a plurality of circuits, and a bump array 354 that electrically connects the circuit body 352 to the package substrate 344 (illustrated in FIG. 3B), and a core bump connector array 355. As provided herein, the bump array 354 can include one or more bump sets 356, 358, 360, 362 and each of the bump sets 356, 358, 360, 362 can include a plurality of signal bumps 364 (also marked with a "S") and a plurality of non-signal bumps 366 alternatingly interspersed and aligned along an axis. As provided herein, each non-signal bump 366 can be either a ground bump 368 (also marked with a "G") or a power bump 370 (also marked with a "P"). With this present design, the bump arrays 354 allows each signal bump 364 to be surrounded by a power bump 370 and a ground bump 368. This can significantly reduce signal-to-signal crosstalk and improve the performance of the integrated circuit 342.

It should be noted that although rectangles are illustrated in certain figures, these are provided to delineate the arrays only, and are not actual structures. Additionally, the use of the terms "first", "second", "third", fourth, etc., are for the sake of convenience and ease in understanding the invention only and are not intended to be limiting in any manner.

In FIG. 3A, the integrated circuit 342 is illustrated as including four bump sets 356, 358, 360, 362 and moving from the center to the outer perimeter of the integrated circuit 342, the bump sets can be labeled as a first bump set 356, a second bump set 358, a third bump set 360, and a fourth bump set 362. In this embodiment, each of the bump sets 356, 358, 360, 362 can be substantially rectangular tube shaped, and the fourth bump set 362 can encircle the third bump set 360, the third bump set 360 can encircle the second bump set 358, the second bump set 358 can encircle the first bump set 356, and the first bump set 356 can encircle the core power connector 355. Additionally, in FIG. 3A, each bump set 356, 358, 360, 362 includes four corner bumps 365 (one positioned at each corner of the each bump set 356, 358, 360, 362). Further, in this embodiment, each corner bump 365 of each bump set 356, 358, 360, 362 is a signal bump 364. Alternatively, the integrated circuit 342 can be designed to include more than four or fewer than four bump sets and/or each set can have a different configuration than rectangular. It should be noted that the labeling of the bump sets 356, 358, 360, 362 as used herein is for convenience, and that the orientation of the first, second, third, and fourth bump sets 356, 358, 360, 362 can be different than that illustrated in FIG. 3A.

In FIG. 3A, the non-signal bumps 366 of each bump set 356, 358, 360, 362 include both power bumps 370 and ground bumps 368, and the power bumps 370 and the ground bumps 368 are alternatingly interspersed, and are substantially equidistantly spaced. With this design, for each bump set 356, 358, 360, 362, each signal bump 364 is positioned adjacent to one power bump 370 and one ground bump 368. Stated in another fashion, for each bump set 356, 358, 360, 362, each signal bump 364 is positioned between one power bump 370 and one ground bump 368. As a result thereof, the distance between the signal bump 364 and the power bump 370 is approximately equal to the distance between the signal bump 364 and the ground bump 368. Further, there is no disparity in the length of each signal-return loop. Thus, the impedance is approximately the same. This will improve the performance of the integrated circuit 342.

The number of bumps (e.g. solder balls) in each of the bump sets 356, 358, 360, 362 can be varied to suit the design requirements of the integrated circuit 342. In the non-exclusive example illustrated in FIG. 3A, (i) the first bump set 356 includes twenty-four bumps (twelve signal bumps 364, six ground bumps 368, and six power bumps 370); (ii) the second bump set 358 includes thirty two bumps (sixteen signal bumps 364, eight ground bumps 368, and eight power bumps 370); (iii) the third bump set 360 includes forty bumps (twenty signal bumps 364, ten ground bumps 368, and ten power bumps 370); and (iv) the fourth bump set 362 includes forty-eight bumps (twenty-four signal bumps 364, twelve ground bumps 368, and twelve power bumps 370). Further, each of the bump sets 356, 358, 360, 362 includes two rows of bumps that are aligned along the X axis, and two columns of bumps that are aligned along the Y axis, and the rows and columns combine to define the generally rectangular tube shaped bump set. In this embodiment, each row includes at least seven collinear bumps, and each column includes at least seven collinear bumps. Moreover, in this embodiment, the bumps in each respective bump set 356, 358, 360, 362 are substantially equidistant from the outer periphery of the integrated circuit 342, and substantially equidistant from the core bump connector array 355.

Figure 3B:
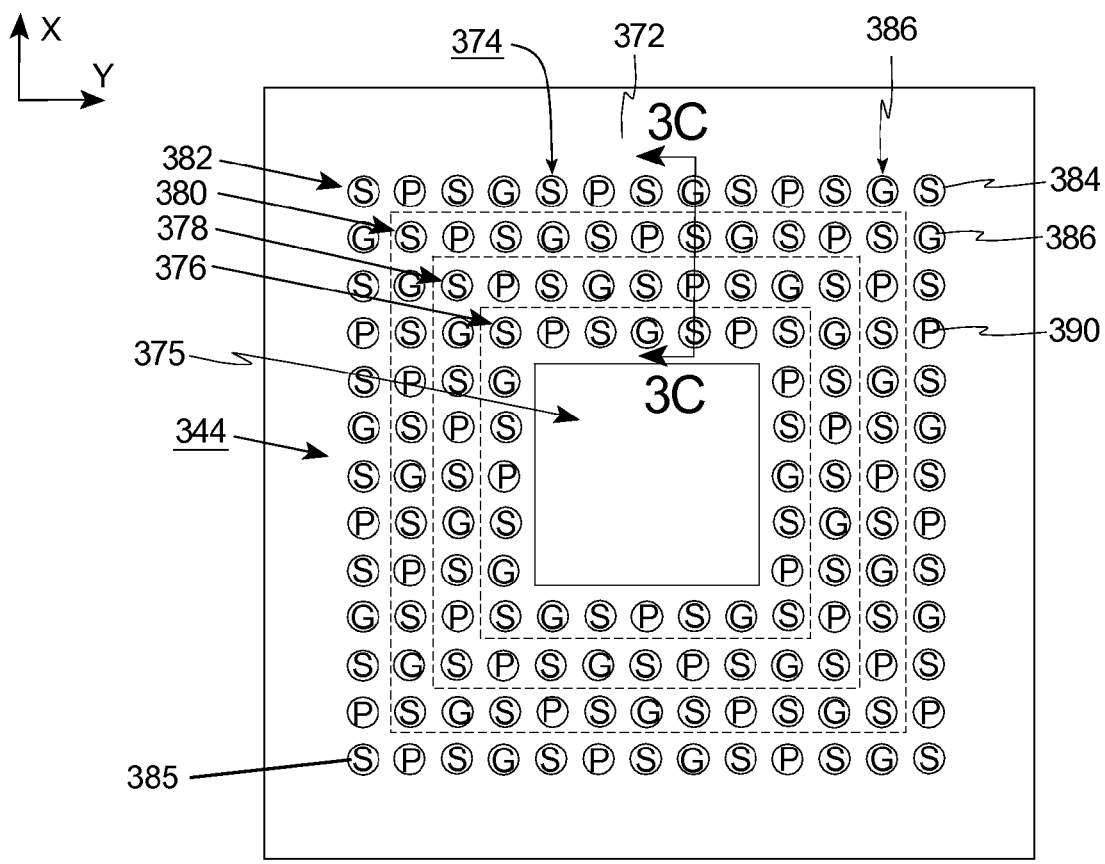
FIG. 3B is a simplified top illustration of a first embodiment of a package having features of the present invention.
Figure 3C:
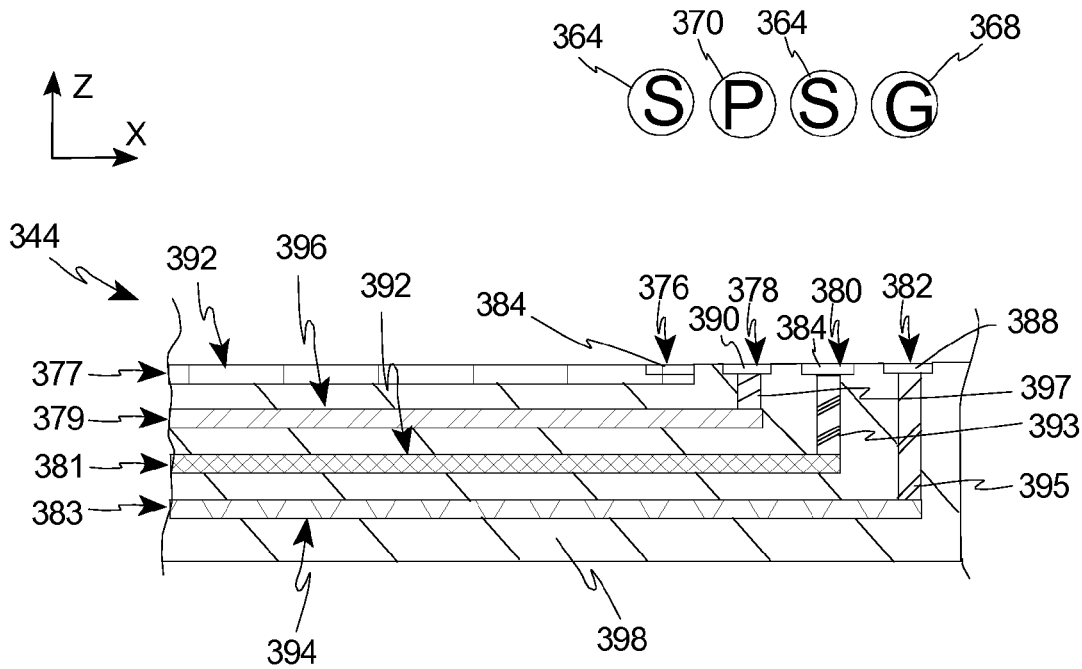
FIG. 3C is a simplified cut-away view taken on line 3C-3C in FIG. 3B with a portion of the bump array positioned above the package substrate.
Figure 3D:
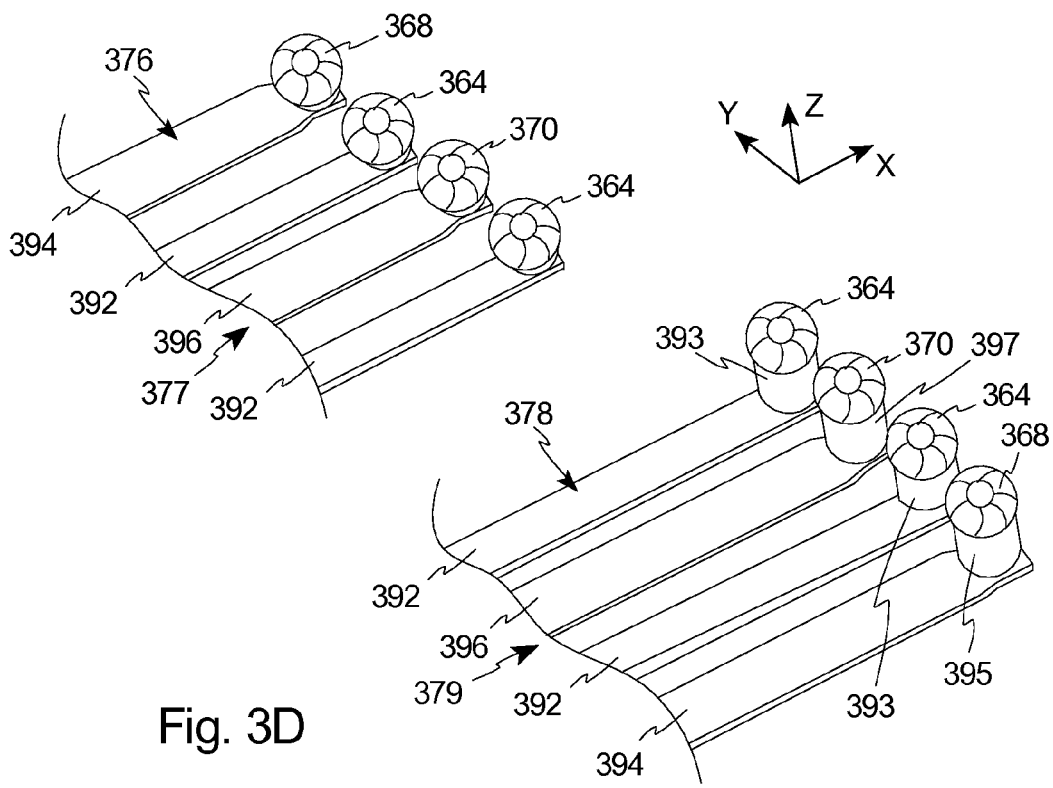
FIG. 3D is an exploded top illustration of a portion of the package substrate of FIG. 3B with a portion of the bump array.

FIG. 3B is a simplified top illustration of a first embodiment of the package substrate 344; FIG. 3C is a simplified cut-away view taken on line 3C-3C in FIG. 3B with some bumps positioned above the package substrate 344; and FIG. 3D is an exploded top illustration of a portion of the package substrate 344 of FIG. 3B with some bumps positioned on the package substrate 344. The package substrate 344 electrically and mechanically connects the integrated circuit 342 (illustrated in FIG. 3A) to the printed circuit board 246 (illustrated in FIG. 2). In this embodiment, the package substrate 344 includes a package body 372, and a pin array 374 that electrically connects to the bump array 354 (illustrated in FIG. 3A), and a core pad connector array 375 that is electrically connected to the core bump connector array 355 (illustrated in FIG. 3A). As provided herein, the pin array 374 corresponds to and mirrors the design of the bump array 354. In this embodiment, the pin array 374 can include one or more pin sets 376, 378, 380, 382 and each of the pin sets 376, 378, 380, 382 can include a plurality of signal pins 384 (also marked with a "S") and a plurality of non-signal pins 386 alternatingly interspersed and aligned along an axis. As provided herein, each non-signal pin 386 can be either a ground pin 388 (also marked with a "G") or a power pin 390 (also marked with a "P"). With this present design, the pin array 374 allows each signal pin 384 to be surrounded by a power pin 390 and a ground pin 388. This can significantly reduce signal-to-signal crosstalk and improve the performance of the integrated circuit 342.

In FIG. 3B, the package substrate 344 is illustrated as including four pin sets 376, 378, 380, 382 and moving from the center to the outer perimeter of the package substrate 344, the pin sets can be labeled as a first pin set 376, a second pin set 378, a third pin set 380, and a fourth pin set 382. In this embodiment, each of the pin sets 376, 378, 380, 382 can be substantially rectangular tube shaped, and the fourth pin set 382 can encircle the third pin set 380, the third pin set 380 can encircle the second pin set 378, the second pin set 378 can encircle the first pin set 376, and the first pin set 376 can encircle the core power connector 375. Alternatively, the package substrate 344 can be designed to include more than four or fewer than four pin sets, and/or each set can have a different configuration than rectangular. It should be noted that the labeling of the pin sets 376, 378, 380, 382 as used herein is for convenience, and that the orientation of the first, second, third, and fourth pin sets 376, 378, 380, 382 can be different than that illustrated in FIG. 3B.

In FIG. 3B, the non-signal pins 386 of each pin set 376, 378, 380, 382 include both power pins 390 and ground pins 388, and the power pins 390 and the ground pins 388 are alternatingly interspersed and are substantially equidistantly spaced. With this design, for each pin set 376, 378, 380, 382, each signal pin 384 is positioned adjacent to one power pin 390 and one ground pin 388. Stated in another fashion, for each pin set 376, 378, 380, 382, each signal pin 384 is positioned between one power pin 390 and one ground pin 388.

The number of pins in each of the pin sets 376, 378, 380, 382 can be varied to suit the design requirements of the integrated circuit 342. In the non-exclusive example illustrated in FIG. 3B, (i) the first bump pin 376 includes twenty-four pins (twelve signal pins 384, six ground pins 388, and six power pins 390); (ii) the second pin set 378 includes thirty two pins (sixteen signal pins 384, eight ground pins 388, and eight power pins 390); (iii) the third pin set 380 includes forty pins (twenty signal pins 384, ten ground pins 388, and ten power pins 390); and (iv) the fourth pin set 382 includes forty-eight pins (twenty-four signal pins 384, twelve ground pins 388, and twelve power pins 390). Further, each of the pin sets 376, 378, 380, 382 includes two rows of pins that are aligned along the X axis, and two columns of pins that are aligned along the Y axis, and the rows and columns combine to define a generally rectangular tube shaped pin set. In this embodiment, each row includes at least seven collinear pins, and each column includes at least seven collinear pins. Moreover, in this embodiment, the pins in each respective pin set 376, 378, 380, 382 are substantially equidistant from the outer periphery of the package substrate 344, and substantially equidistant from the core power connector 375. Additionally, in FIG. 3B, each pin set 376, 378, 380, 382 includes four corner pins 385 (one positioned at each corner of the each pin set 376, 378, 380, 382). Further, in this embodiment, each corner pin 385 of each pin set 376, 378, 380, 382 is a signal pin 384.

FIG. 3C is a cut-way view that illustrates a portion of the package substrate 344 in more detail. In this embodiment, in addition to the pins, the package substrate 344 includes a plurality of signal traces 392, a plurality of ground traces 394, a plurality of power traces 396, and one or more insulation layers 398 that separate the traces 392, 394, 396. Additionally, in this embodiment, except for the pins 384, 388, 390 in the first pin set 376, (i) for each signal pin 384, a signal via 393 electrically connects the signal pin 384 to the signal trace 392; (ii) for each ground pin 388, a ground via 395 electrically connects the ground pin 388 to the ground trace 394; and (iii) for each power pin 390, a power via 397 electrically connects the power pin 390 to the power trace 396.

Moreover, in this embodiment, (i) the signal traces 392, the ground traces 394, and the power traces 396 that are part of the first pin set 376 are positioned in a first plane 377 (positioned in the X-Y axis) of the package substrate 344; (ii) the signal traces 392, the ground traces 394, and the power traces 396 that are part of the second pin set 378 are positioned in a second plane 379 (positioned in the X-Y axis) of the package substrate 344; (iii) the signal traces 392, the ground traces 394, and the power traces 396 that are part of the third pin set 380 are positioned in a third plane 381 (positioned in the X-Y axis) of the package substrate 344; and (iv) the signal traces 392, the ground traces 394, and the power traces 396 that are part of the fourth pin set 382 are positioned in a fourth plane 383 (positioned in the X-Y axis) of the package substrate 344. Further, the planes 377, 379, 381, 383 are parallel to each other and spaced apart from each other along the Z axis.

In FIG. 3C, each bump 364, 368, 370 is secured (e.g. by melting) to its respective pin 384, 388, 390.

FIG. 3D is an exploded top illustration of (i) four consecutive traces (e.g. two signal traces 392, one ground trace 394, and one power trace 396) of the first pin set 376, and (ii) four consecutive traces (e.g. two signal traces 392, one ground trace 394, and one power trace 396) of the second pin set 378; (iii) four bumps (e.g. two signal bumps 364, one ground bump 368, and one power bump 370) electrically connected to the traces of the first pin set 376; and (iv) four bumps (e.g. two signal bumps 364, one ground bump 368, and one power bump 370) electrically connected to the traces of the second pin set 378.

It should be noted that a couple of traces of only two of the pin sets 376, 378 are illustrated and that the traces of the third pin set and the fourth pin set are not illustrated in FIG. 3D for clarity.

It should also be noted that the traces 392, 394, 396 of the first pin set 376 are positioned in the same first plane 377, and the traces 392, 394, 396 of the second pin set 378 are positioned in the same second plane 379. With this design, the planes 377, 379 are parallel to each other and spaced apart along the Z axis.

FIG. 3D illustrates that with the present layout, there are no escape neckdowns for the signal traces 392. Stated in another fashion, this routing avoids escape neckdowns and provides clean reference strips for each signal trace 392. Further, signal-to-signal crosstalk is significantly lower with non-signal traces 394, 396 separating every two signal traces 392 for each plane 377, 379, 381, 383. This design facilitates better routing of the traces and better utilization of the area of the package substrate 344. Moreover, there are no dedicated power or ground planes.

Figure 4A:
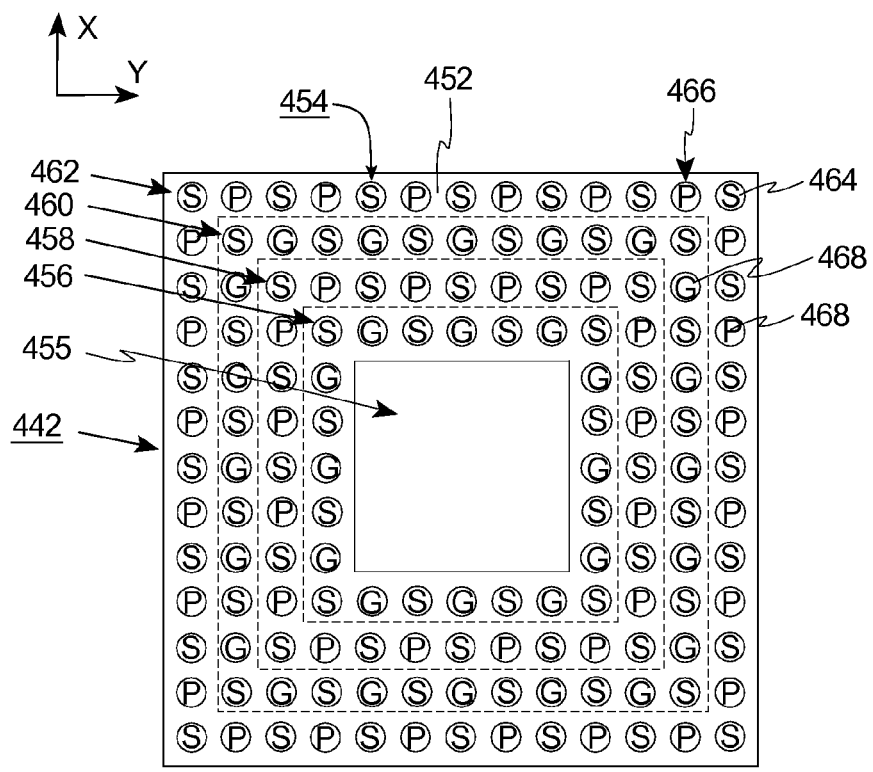
FIG. 4A is a simplified bottom illustration of another embodiment of an integrated circuit having features of the present invention.

FIG. 4A is a simplified bottom illustration of another embodiment of an integrated circuit 442 having features of the present invention. In this embodiment, the integrated circuit 442 again includes a circuit body 452, and a bump array 454 that electrically connects the circuit body 452 to the package substrate 444 (illustrated in FIG. 4B), and a core bump connector array 455. Moreover, in this embodiment, the bump array 454 again includes a first bump set 456, a second bump set 458, a third bump set 460, and a fourth bump set 462, and each of the bump sets 456, 458, 460, 462 includes a plurality of signal bumps 464 (also marked with a "S") and a plurality of non-signal bumps 466 alternatingly interspersed and aligned along an axis. As provided herein, each non-signal bump 466 can be either a ground bump 468 (also marked with a "G") or a power bump 470 (also marked with a "P").

In FIG. 4A, the four bump sets 456, 458, 460, 462 and similar in shape and size to the bumps set 356, 358, 360, 362 described above and illustrated in FIG. 3A.

In FIG. 4A, (i) the non-signal bumps 466 of the first bump set 456, and the third bump set 460 include only ground bumps 468, and the ground bumps 368 are alternatingly interspersed with the signal bumps 466, and are substantially equidistantly spaced; and (ii) the non-signal bumps 466 of the second bump set 458, and the fourth bump set 462 include only power bumps 470, and the power bumps 470 are alternatingly interspersed with the signal bumps 466, and are substantially equidistantly spaced. With this design, most of the signal bumps 464 are positioned adjacent to one power bump 470 and one ground bump 468. As a result thereof, the distance between the signal bump 464 and the power bump 470 is approximately equal to the distance between the signal bump 464 and the ground bump 468. Thus, the impedance is approximately the same. This will improve the performance of the integrated circuit 442.

Figure 4B:
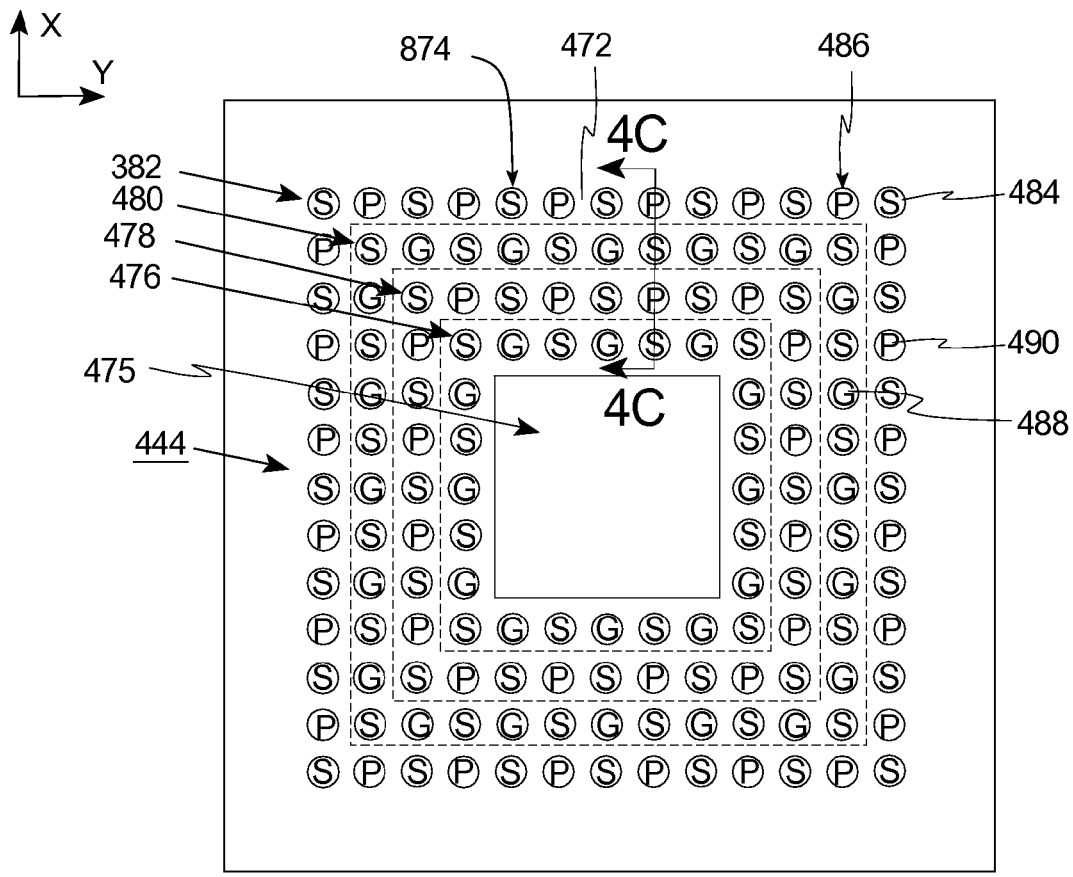
FIG. 4B is a simplified top illustration of another embodiment of a package substrate having features of the present invention.
Figure 4C:
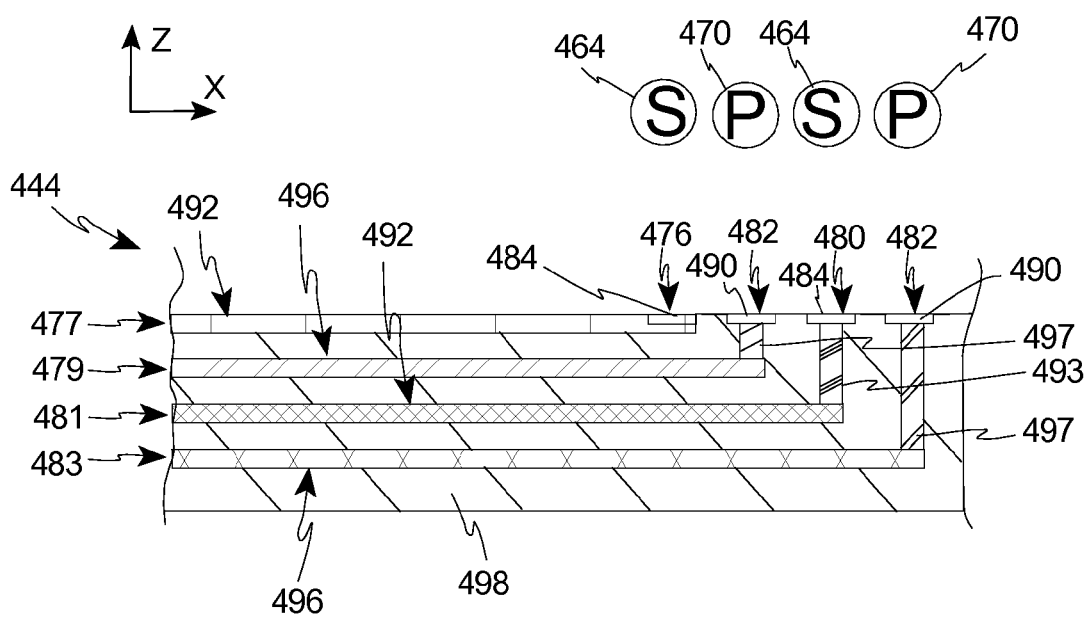
FIG. 4C is a simplified cut-away view taken on line 4C-4C in FIG. 4B with a portion of the bump array positioned above the package substrate.

FIG. 4B is a simplified top illustration of another embodiment of the package substrate 444; and FIG. 4C is a simplified cut-away view taken on line 4C-4C in FIG. 4B with some bumps positioned above the package substrate 444. In this embodiment, the package substrate 444 again includes a package body 472, and a pin array 474 that electrically connects to the bump array 454 (illustrated in FIG. 4A), and a core pad connector array 475. In this embodiment, the pin array 474 again includes a first pin set 476, a second pin set 478, a third pin set 480, and a fourth pin set 482 and each of the pin sets 476, 478, 480, 482 can include a plurality of signal pins 484 (also marked with a "S") and a plurality of non-signal pins 486 alternatingly interspersed and aligned along an axis. Further, each non-signal pin 486 can be either a ground pin 488 (also marked with a "G") or a power pin 490 (also marked with a "P").

In FIG. 4B, the four pin sets 476, 478, 480, 482 and similar in shape and size to the pin set 376, 378, 380, 382 described above and illustrated in FIG. 3B.

In FIG. 4B, (i) the non-signal pins 486 of the first pin set 476, and the third pin set 480 include just ground pins 488, and the ground pins 488 are alternatingly interspersed with the signal pins 484 and are substantially equidistantly spaced; and (ii) the non-signal pins 486 of the second pin set 478, and the fourth pin set 482 include just power pins 490, and the power pins 490 are alternatingly interspersed with the signal pins 484 and are substantially equidistantly spaced.

FIG. 4C is a cut-way view that illustrates a portion of the package substrate 444 in more detail. In this embodiment, in addition to the pins, the package substrate 444 includes a plurality of signal traces 492, a plurality of ground traces (not shown), a plurality of power traces 496, and one or more insulation layers 498 that separate the traces 492, 496. Additionally, in this embodiment, except for the pins 384, 388, 390 in the first pin set 376, (i) for each signal pin 484, a signal via 493 electrically connects the signal pin 484 to the signal trace 492; (ii) for each ground pin, a ground via (not shown) electrically connects the ground pin 488 to the ground trace; and (iii) for each power pin 490, a power via 497 electrically connects the power pin 490 to the power trace 496.

Moreover, in this embodiment, (i) the signal traces 492, and the ground traces that are part of the first pin set 476 are positioned in a first plane 477 (positioned in the X-Y axis) of the package substrate 444; (ii) the signal traces 492, and the power traces 496 that are part of the second pin set 478 are positioned in a second plane 479 (positioned in the X-Y axis) of the package substrate 444; (iii) the signal traces 492, and the ground traces that are part of the third pin set 480 are positioned in a third plane 481 (positioned in the X-Y axis) of the package substrate 444; and (iv) the signal traces 492, and the power traces 496 that are part of the fourth pin set 482 are positioned in a fourth plane 483 (positioned in the X-Y axis) in the same plane of the package substrate 444. Further, the plane 477, 479, 481, 483 are parallel to each other and spaced apart from each other along the Z axis. This arrangement has somewhat similar benefits as the embodiment illustrated in FIGS. 3A-3D and described above.

Additionally, in FIG. 4C, each bump 464, 470 is secured (e.g. by melting) to its respective pin 484, 490.

While the particular circuit assembly including the embodiments of bump arrays and pin arrays as herein shown and disclosed in detail are fully capable of obtaining the objects and providing the advantages herein before stated, it is to be understood that they are merely illustrative of one or more embodiments and that no limitations are intended to the details of construction or design herein shown other than as described in the appended claims.

What is claimed is:

1. A circuit assembly comprising:
   a printed circuit board;
   a package substrate electrically connected to the printed circuit board, the package substrate including a package body; and a pin array that electrically connects the package body to the integrated circuit, the pin array including (i) a first pin set that is rectangular tube shaped and includes a plurality of signal pins and a plurality of non-signal pins that are alternatingly interspersed around the rectangular tube shaped first pin set; and (ii) a second pin set that is rectangular tube shaped and that encircles the first pin set, wherein the second pin set includes a plurality of signal pins and a plurality of non-signal pins that are alternatingly interspersed around the rectangular tube shaped second pin set; wherein each non-signal pin is either a ground pin or a power pin; and wherein each pin set includes four corner pins, and wherein each corner pin of each pin set is a signal pin; and
   an integrated circuit including a circuit body; and a bump array that is electrically connected to the pin array of the package substrate, the bump array including (i) a first bump set that is rectangular tube shaped and includes a plurality of signal bumps and a plurality of non-signal bumps that are alternatingly interspersed around the rectangular tube shaped first bump set; and (ii) a second bump set that is rectangular tube shaped and that encircles the first bump set, wherein the second bump set includes a plurality of signal bumps and a plurality of non-signal bumps that are alternatingly interspersed around the rectangular tube shaped second bump set; wherein each non-signal bump is either a ground bump or a power bump; and wherein each bump set includes four corner bumps, and wherein each corner bump of each bump set is a signal bump.

2. The circuit assembly of claim 1 wherein the pin array further includes a third pin set that is rectangular tube shaped and that encircles the second pin set, wherein the third pin set includes a plurality of signal pins and a plurality of non-signal pins that are alternatingly interspersed around the rectangular tube shaped third pin set; and wherein the bump array further includes a third bump set that is rectangular tube shaped and that encircles the second bump set, wherein the third bump set includes a plurality of signal pins and a plurality of non-signal pins that are alternatingly interspersed around the rectangular tube shaped third bump set.

3. The package substrate of claim 2 wherein the bump array further includes a fourth pin set that is rectangular tube shaped and that encircles the third pin set, wherein the fourth pin set includes a plurality of signal pins and a plurality of non-signal pins that are alternatingly interspersed around the rectangular tube shaped fourth pin set; and wherein the bump array further includes a fourth bump set that is rectangular tube shaped and that encircles the third bump set, wherein the fourth bump set includes a plurality of signal pins and a plurality of non-signal pins that are alternatingly interspersed around the rectangular tube shaped fourth bump set.

4. A package substrate that is adapted to electrically connect an integrated circuit to a substrate, the package substrate comprising:
a package body; and
a pin array that electrically connects the package body to the integrated circuit, the pin array including (i) a first pin set that is rectangular tube shaped and includes a plurality of signal pins and a plurality of non-signal pins that are alternatingly interspersed around the rectangular tube shaped first pin set; and (ii) a second pin set that is rectangular tube shaped and that encircles the first pin set, wherein the second pin set includes a plurality of signal pins and a plurality of non-signal pins that are alternatingly interspersed around the rectangular tube shaped second pin set; wherein each non-signal pin is either a ground pin or a power pin.

5. The package substrate of claim 4 wherein each non-signal pin in the first pin set is a ground pin, and each non-signal pin in the second pin set is a power pin.

6. The package substrate of claim 4 wherein each non-signal pin in the first pin set is a power pin, and each non-signal pin in the second pin set is a ground pin.

7. The package substrate of claim 4 wherein each pin set includes a repeating pattern of signal pin, power pin, signal pin, ground pin around the respective pin set.

8. The package substrate of claim 4 further comprising a third pin set that is rectangular tube shaped and that encircles the second pin set, wherein the third pin set includes a plurality of signal pins and a plurality of non-signal pins that are alternatingly interspersed around the rectangular tube shaped third pin set.

9. The package substrate of claim 8 further comprising a fourth pin set that is rectangular tube shaped and that encircles the third pin set, wherein the fourth pin set includes a plurality of signal pins and a plurality of non-signal pins that are alternatingly interspersed around the rectangular tube shaped fourth pin set.

10. The package substrate of claim 9 wherein each pin set includes four corner pins, and wherein each corner pin of each pin set is a signal pin.

11. The package substrate of claim 9 wherein each pin set includes a repeating pattern of signal pin, power pin, signal pin, ground pin around the respective pin set.

12. An integrated circuit that is adapted to be electrically connected to a package substrate, the integrated circuit comprising:
a circuit body; and
a bump array that electrically connects the circuit body to the package substrate, the bump array including (i) a first bump set that is rectangular tube shaped and includes a plurality of signal bumps and a plurality of non-signal bumps that are alternatingly interspersed around the rectangular tube shaped first bump set; and (ii) a second bump set that is rectangular tube shaped and that encircles the first bump set, wherein the second bump set includes a plurality of signal bumps and a plurality of non-signal bumps that are alternatingly interspersed around the rectangular tube shaped second bump set; wherein each non-signal bump is either a ground bump or a power bump.

13. The integrated circuit of claim 12 wherein each non-signal bump in the first bump set is a ground bump, and each non-signal bump in the second bump set is a power bump.

14. The integrated circuit of claim 12 wherein each non-signal bump in the first bump set is a power bump, and each non-signal bump in the second bump set is a ground bump.

15. The integrated circuit of claim 12 wherein each bump set includes a repeating pattern of signal bump, power bump, signal bump, ground bump around the respective bump set.

16. A circuit assembly including the integrated circuit of claim 12 and a package substrate electrically connected to the integrated circuit, the package substrate including (i) a package body; and (ii) a first pin set that is rectangular tube shaped and includes a plurality of signal pins and a plurality of non-signal pins that are alternatingly interspersed around the rectangular tube shaped first pin set; and (ii) a second pin set that is rectangular tube shaped and that encircles the first pin set, wherein the second pin set includes a plurality of signal pins and a plurality of non-signal pins that are alternatingly interspersed around the rectangular tube shaped second pin set; wherein each non-signal pin is either a ground pin or a power pin; wherein the first pin set is electrically connected to the first bump set; and wherein the second pin set is electrically connected to the second bump set.

17. The integrated circuit of claim 12 further comprising a third bump set that is rectangular tube shaped and that encircles the second bump set, wherein the third bump set includes a plurality of signal bumps and a plurality of non-signal bumps that are alternatingly interspersed around the rectangular tube shaped third bump set.

18. The integrated circuit of claim 17 further comprising a fourth bump set that is rectangular tube shaped and that encircles the third bump set, wherein the fourth bump set includes a plurality of signal bumps and a plurality of non-signal bumps that are alternatingly interspersed around the rectangular tube shaped fourth bump set.

19. The integrated circuit of claim 18 wherein each bump set includes four corner bumps, and wherein each corner bump of each bump set is a signal bump.

20. The integrated circuit of claim 18 wherein each bump set includes a repeating pattern of signal bump, power bump, signal bump, ground bump around the respective bump set.

* * * * *